(12) United States Patent
Tsai et al.

(10) Patent No.: US 7,075,515 B2
(45) Date of Patent: Jul. 11, 2006

(54) METHOD AND APPARATUS FOR TESTING A JOYSTICK CONTROL CIRCUIT

(75) Inventors: Ming-Cheng Tsai, Taipei Hsien (TW); Te-Hung Wang, Taipei Hsien (TW); Ing-Bor Hsieh, Taiepi (TW)

(73) Assignee: Via Technologies, Inc., Taiepi Hsien (TW)

( * ) Notice: Subject to any disclaimer, the term of this patent is extended or adjusted under 35 U.S.C. 154(b) by 771 days.

(21) Appl. No.: 09/950,216

(22) Filed: Sep. 7, 2001

(65) Prior Publication Data

US 2002/0105499 A1 Aug. 8, 2002

(30) Foreign Application Priority Data

Feb. 5, 2001 (TW) .................................... 90102340 A

(51) Int. Cl.
*G09G 5/08* (2006.01)

(52) U.S. Cl. ....................................... 345/161; 702/117
(58) Field of Classification Search ................. 345/161; 364/190; 463/38; 702/117; 439/912
See application file for complete search history.

(56) References Cited

U.S. PATENT DOCUMENTS 5,628,686 A * 5/1997 Svancarek et al. ............ 463/36
6,522,986 B1 * 2/2003 Chu et al. .................... 702/117

* cited by examiner

*Primary Examiner*—Jimmy H. Nguyen
(74) *Attorney, Agent, or Firm*—J.C. Patents

(57) ABSTRACT

An apparatus for joystick control circuit, used in connection with a game port that is connected to the joystick control circuit and comprises a plurality of pins addressed to a plurality of joystick buttons, comprises: a connector, an electric switch, and a latch device. The connector comprises a plurality of pinholes that corresponds to the plurality of pins of the game port addressed to the joystick buttons, and a signal pinhole, such that the apparatus is connected to the joystick control circuit through the connector. The electric switches is connected to the pinholes of the connector that are addressed to the joystick buttons to perform either a short-circuit or open circuit of the joystick button addressed pinholes. The latch device is connected to the electric switch and the signal pinhole, such that the latch device commands the electric switch when receiving a signal from the signal pinhole.

13 Claims, 4 Drawing Sheets

METHOD AND APPARATUS FOR TESTING A JOYSTICK CONTROL CIRCUIT

CROSS-REFERENCE TO RELATED APPLICATION

This application claims the priority benefit of Taiwan application serial no. 90102340, filed Feb. 5, 2001.

BACKGROUND OF THE INVENTION

1. Field of the Invention

The invention relates to a testing device for a joystick control circuit, and a method for testing a joystick control circuit, more particularly to a testing device for a joystick control circuit, and a method for testing a joystick control circuit that can be used on a motherboard fabrication line.

2. Description of the Related Art

After the fabrication of the motherboard is completed, the motherboard and every component circuit thereof must be tested before they are delivered to the clients. The testing of the motherboard conventionally takes place on a fabrication line and requires human intervention. More particularly, the game port connected to a joystick control circuit is tested among all the component circuits of the motherboard that are tested.

To test the joystick control circuit, a testing station is generally built up on a motherboard fabrication line. Conventionally, when a motherboard arrives at the testing station, a testing device is then connected to a game port of the motherboard to simulate different actions of the joystick. Those actions comprise, for example, a displacement of the joystick along an X direction and a Y direction within a given reference (X, Y), a push-on action of the joystick buttons, and a release action thereof.

Referring to FIG. 1, the circuit design of a conventional testing device for a joystick control circuit is schematically shown. The testing device 100 conventionally has 15 pinholes corresponding to the pins of the game port of the motherboard, and is designed such that it tests the joystick control circuit with respect to a simulated manipulation of the joystick. In the testing device 100, a first resistor 102 is connected between the pinhole 1 and the pinhole 3, and a second resistor 104 is connected between the pinhole 1 and the pinhole 11. The first and second resistors 102 and 104 have fixed resistance values and simulate given displacements along an X direction. A third resistor 106 and a fourth resistor 108, with fixed resistance values, are respectively connected between the pinholes 8 and 6 and the pinholes 8 and 13, and simulate given displacements along a Y direction.

In turn, circuits between pinholes 2 and 5, pinholes 7 and 5, pinholes 10 and 5, and pinholes 14 and 5 are addressed to buttons of the joystick, wherein the foregoing pinholes are also connected to a short circuit node 110. The short circuit of the pinholes 2, 5, 7, 10, and 14 through the node 110 conventionally represents a push-on action of the joystick buttons while, when there is no short circuit; the joystick buttons should be in a release state.

Referring to FIG. 2, a flow diagram illustrates the conventional testing method of a joystick control circuit with the testing device described above. First, the testing device 100 is connected to a game port (step 202), thereby testing the joystick control circuit with respect to a simulated manipulation of the joystick. Then, according to the results of the testing, it is determined whether the joystick control circuit is functioning normally (step 204). Since the pinholes 2, 5, 7, 10, and 14 of the testing device 100 are short-circuited when it is connected to the game port of the motherboard, a push-on state of the joystick buttons is thus also simulated. If the response of the joystick control circuit is a push-on state of not all of the joystick buttons, the joystick control circuit is evaluated as deficient. If the response of the joystick control circuit is a push-on state of all of the joystick buttons, the joystick control circuit is then evaluated as functioning normally. If the joystick buttons function normally, a testing program (not shown) then outputs a signal to request the tester employee to remove the testing device 100 from the game port (step 206). After the tester employee has removed the testing device 100 and confirmed its removal (step 208), the joystick control circuit is tested again with respect to a simulated release state of the joystick. Then, according to the results of the test, it is determined whether the joystick control circuit responds normally with respect to the release state of the joystick (step 210). With reference to the testing of the joystick buttons described above, since the testing device 100 is removed, the pins of the game port of the motherboard addressed to the joystick buttons are no longer short-circuited, which is equivalent to a release state of the joystick buttons. Consequently, if the response of the joystick control circuit is not a release of all of the joystick buttons, the joystick control circuit then is evaluated as deficient. If the response signal of the joystick control circuit is a release of all of the buttons, the joystick control circuit is evaluated as functioning normally.

In the traditional method such as described above, the tester employee, when receiving the removal information from the testing program, must manually remove the testing device from the game port and confirm the second testing with respect to a release state. Such a manual manipulation may limit the testing efficiency, and, more generally, may affect the delivery time to the clients. A more efficient testing method thus is needed.

SUMMARY OF THE INVENTION

One major aspect of the present invention is to provide a testing device for a joystick control circuit and a method for testing a joystick control circuit, wherein manual manipulation can be eliminated to reduce the testing time and increase the testing efficiency.

To achieve the foregoing and other objects of the present invention, the testing device of the present invention, used in connection with a game port that is connected to the joystick control circuit and comprises a plurality of pins addressed to a plurality of joystick buttons, comprises: a connector, an electric switch, and a latch device. The connector comprises a plurality of pinholes that correspond to the plurality of pins of the game port addressed to the joystick buttons, and a signal pinhole, such that the testing device is connected to the joystick control circuit through the connector. The electric switch is connected to the pinholes of the connector that are addressed to the joystick buttons to perform either a short-circuit or open-circuit of the joystick button-addressed pinholes. The latch device is connected to the electric switch and the signal pinhole, such that the latch device commands the electric switch when receiving a signal from the signal pinhole.

To achieve the above and other objects, the present invention further provides a method for testing a joystick control circuit, used in connection with a game port that is in turn connected to the joystick control circuit to be tested, wherein the game port comprises a plurality of pins addressed to a plurality of joystick buttons. The method for testing a joystick control circuit comprises: providing a testing device that has a latch device, wherein the testing device can, under an order signal, either short-circuit or open-circuit the pins of the game port addressed to the joystick buttons; connecting the testing device to the game port; outputting a short-circuit signal to command the testing device to short-circuit the pins of the game port addressed to the joystick buttons; determining whether the joystick control circuit is in a state in accord with a push-on of the joystick buttons; outputting an open-circuit signal to command the testing device to open-circuit the pins of the game port addressed to the joystick buttons; and determining whether the joystick control circuit is in a state in accord with a release of the joystick buttons.

With the testing device of the present invention, conventional manual manipulation of the tester employee for removing the connector of the testing device can be substituted with an automatic disconnection commanded by, for example, a testing program used with the testing device. Thereby, testing time and efficiency can be improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

The following detailed description of the embodiments and examples of the present invention with reference to the accompanying drawings is only illustrative and not limiting.

Figure 1:
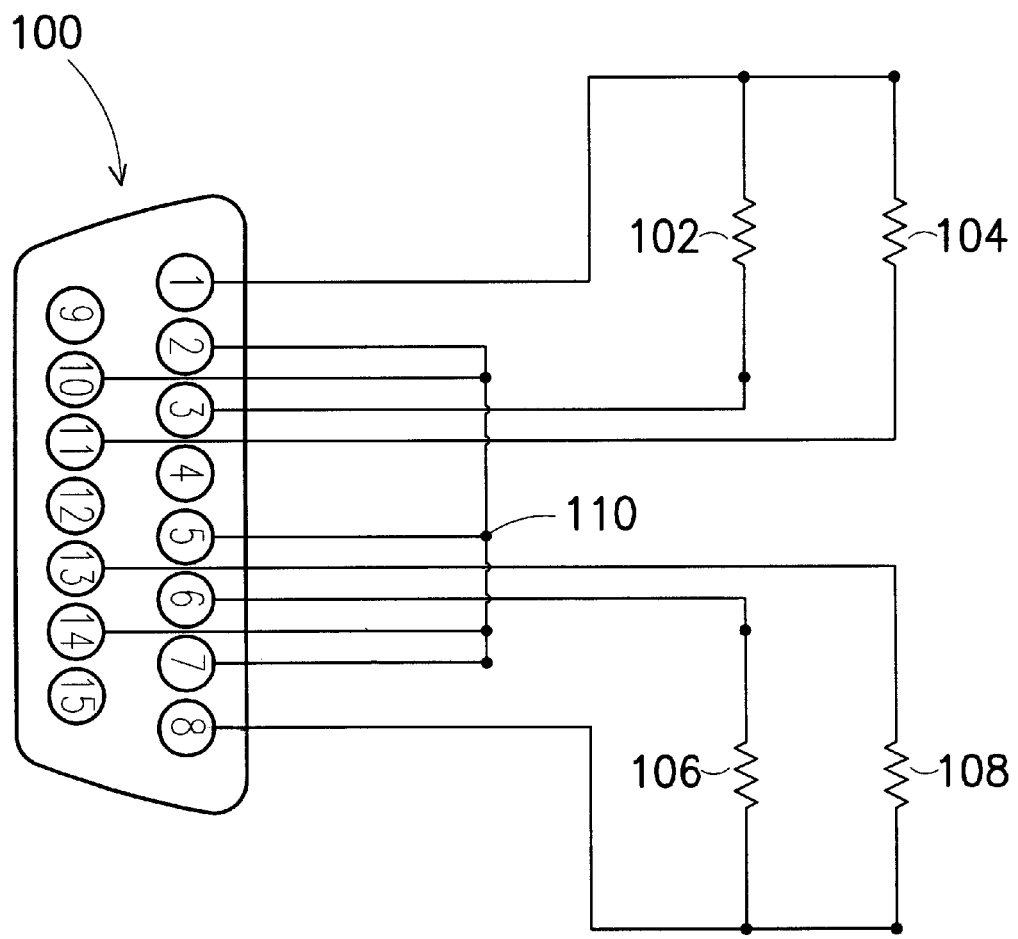
FIG. 1 is a diagram illustrating a conventional circuit design of a testing device for joystick control circuit.
Figure 2:
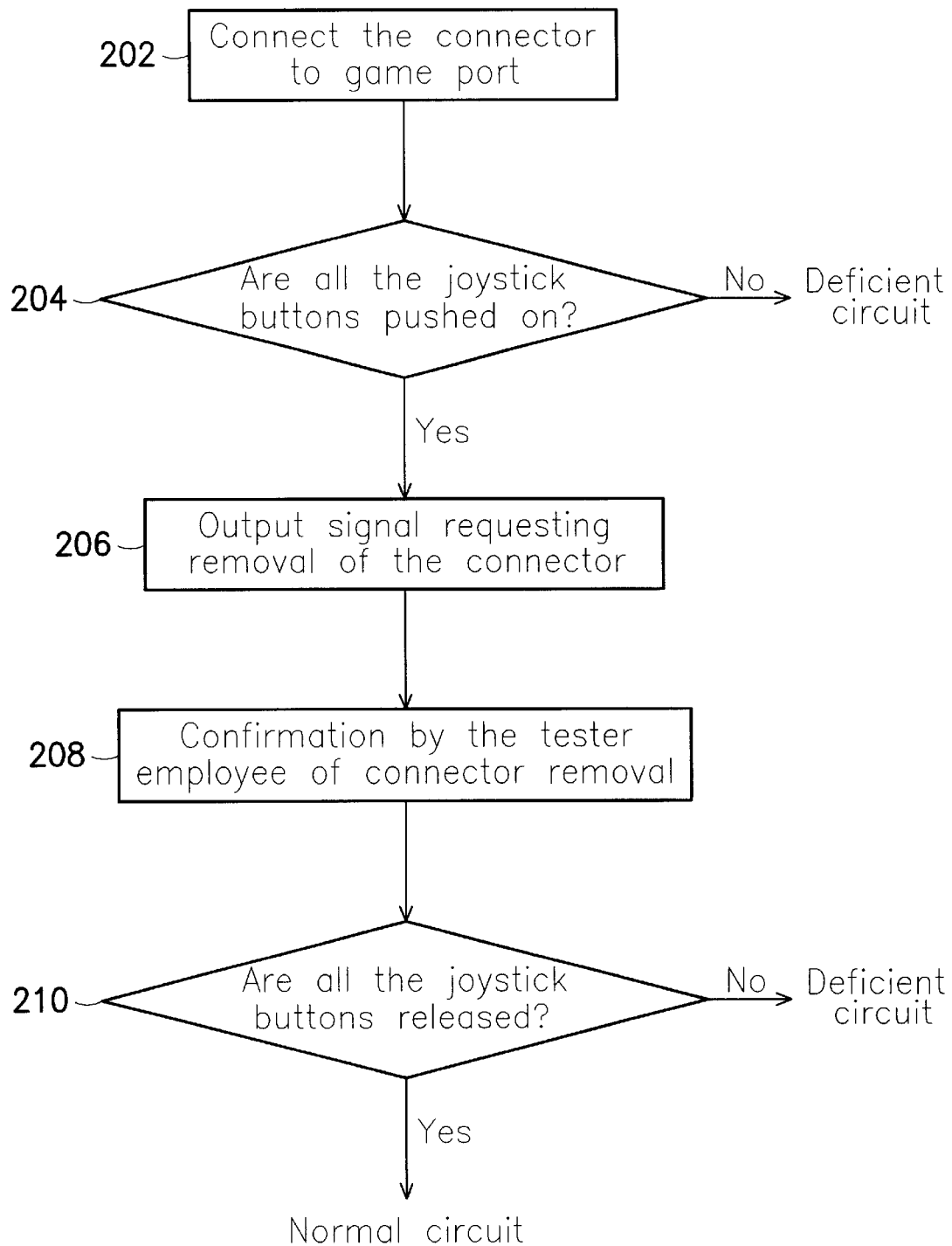
FIG. 2 is a flow diagram illustrating a conventional method for testing a joystick control circuit, using the conventional testing device.
Figure 3:
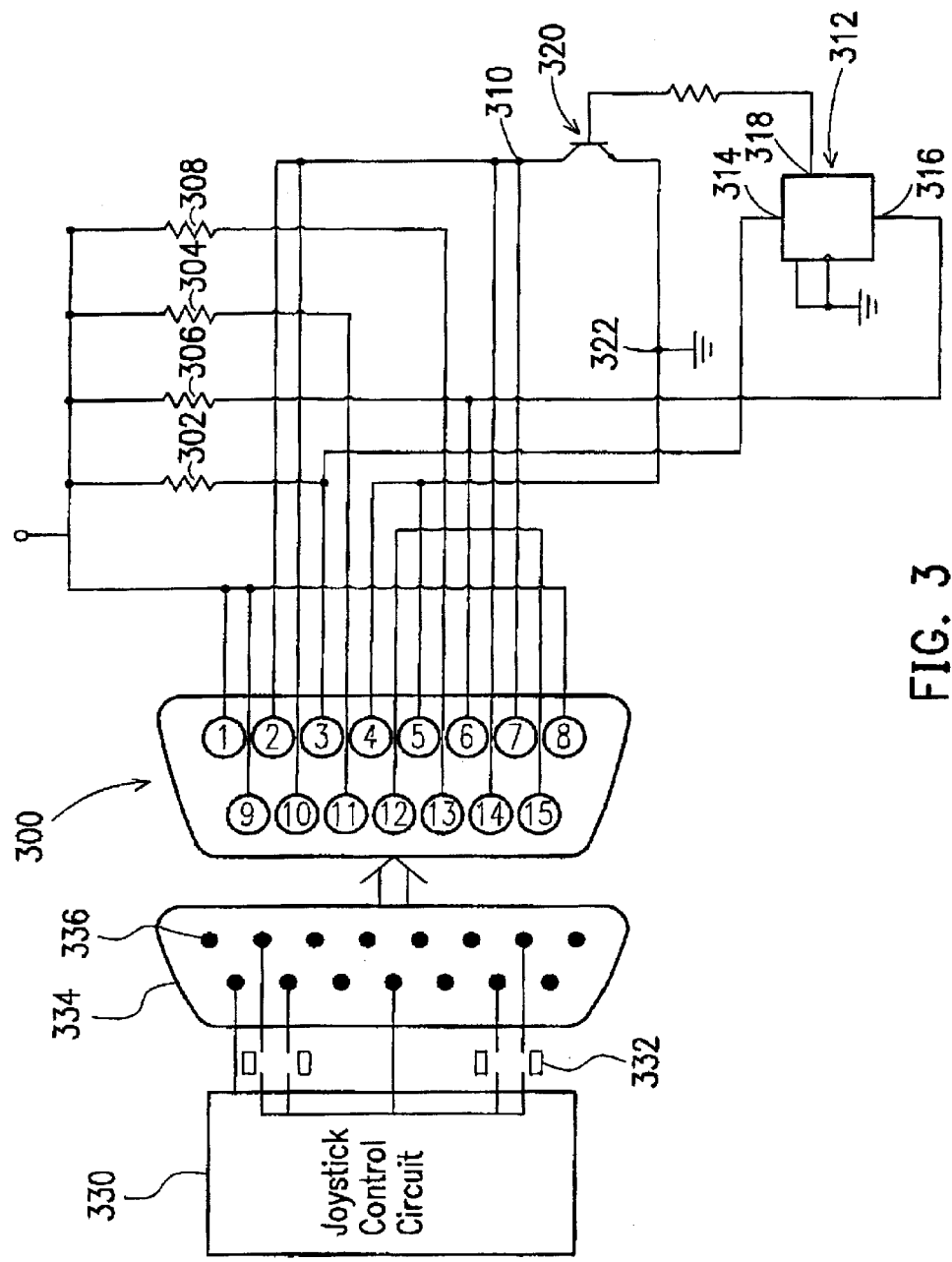
FIG. 3 is a diagram illustrating the circuit design of a testing device for a joystick control circuit according to an embodiment of the present invention.

Referring to FIG. 3, the design of a testing device for a joystick control circuit according to an embodiment of the present invention is schematically shown. The testing device of the present invention can be connected to a game port of a motherboard, wherein the game port comprises a plurality of pins connected to a joystick control circuit to be tested (not shown). The testing device of the present invention is used with, for instance, a testing program that manages the signal from the joystick control circuit resulting from simulation by the testing device (not shown). The results of the testing can be then directly shown to a tester employee through, for example, a display means (not shown).

The testing device of the present invention comprises at least a connector 300, a latch device 312, a switch 320, and a plurality of resistors with fixed resistance 302, 304, 306, and 308. The connector 300 has a plurality of pinholes that corresponds to the pins 336 of the game port 334, which typically amounts to fifteen pins and coupled with the joystick control circuit 330 as for example shown in FIG. 3, and can simulate the connection of a first and second joystick to the game port. In the testing device of the present invention, the resistor 302 is connected between pinholes 3 and 1, and the resistor 304 is connected between pinholes 11 and 1. Both resistors 302 and 304 simulate given displacements respectively of the first and second joysticks along an X direction. The resistor 306 is connected between pinholes 6 and 1, and the resistor 308 is connected between pinholes 13 and 1. Both resistors 306 and 308 simulate given displacements respectively of the first and second joysticks along a Y direction. Pinholes 8 and 9, connected to pinhole 1, are consequently also connected to the resistors 302, 304, 306, and 308, wherein one of either the pinhole 1, pinhole 8 or pinhole 9 is connected to a continuous voltage source.

The port game of the motherboard also comprises four pins addressed to the joystick buttons 332, to which correspond four pinholes of the connector 300, respectively designated as pinholes 2, 7, 10, and 14. The pinholes 2, 7, 10, and 14 are all connected to a short circuit node 310. Pinholes 4 and 5 are respectively connected to a ground node 322.

The electric switch 320, for example a transistor, is connected between the short circuit node 310 and the ground node 322. Thus, according to the state of the electric switch 320, the pinholes addressed to the joystick buttons can be either connected to the ground nodes 322, thereby in short-circuit state, or not connected to the ground node 322, thereby in an open-circuit state. As described above, the short circuit state simulates a configuration where the joystick buttons are pushed on while, in an open-circuit state, the configuration is that of a release of the joystick buttons.

The latch device 312, for example a flip-flop device, is connected to a plurality of signal pinholes of the connector 300 by input nodes 314 and 316, and the latch device 312 is connected to the electric switch 320 through an output node 318. In such a circuit design, according to order signals received at the input nodes 314 and 316, the latch device 312 can command the electric switch 320 by turning it either in a closed state, thereby short-circuiting the pinholes addressed to the joystick buttons, or in an open state, thereby simulating the joystick buttons in a release state. In the present invention, pinhole 3 and pinhole 6 are used to receive the signal orders. Hence, the pinholes 3 and 6 alternatively serve as input signal pinholes in the testing configuration or otherwise serve as output signal pinholes. The pins 3 and 6 of the game port corresponding to the pinholes 3 and 6 of the connector are thus alternatively used as a signal output in a testing configuration or otherwise are used as a signal input.

If a push-on state of the joystick buttons is simulated, the testing program outputs a short-circuit signal to the latch device 312 through the pinhole 3. The latch device 312, through the signal output node 318, in turn commands the electric switch 320 by turning it into a closed state, thereby effectively short-circuiting the pinholes addressed to the joystick buttons. In contrast, if a release state of the joystick buttons is simulated, the testing program outputs an open-circuit signal to the latch device 312 through the signal pinhole 6. The latch device 312, through the output node 318, then turns the electric switch 320 into an open state, thereby open-circuiting the pinholes addressed to the joystick buttons from the ground node 322.

Figure 4:
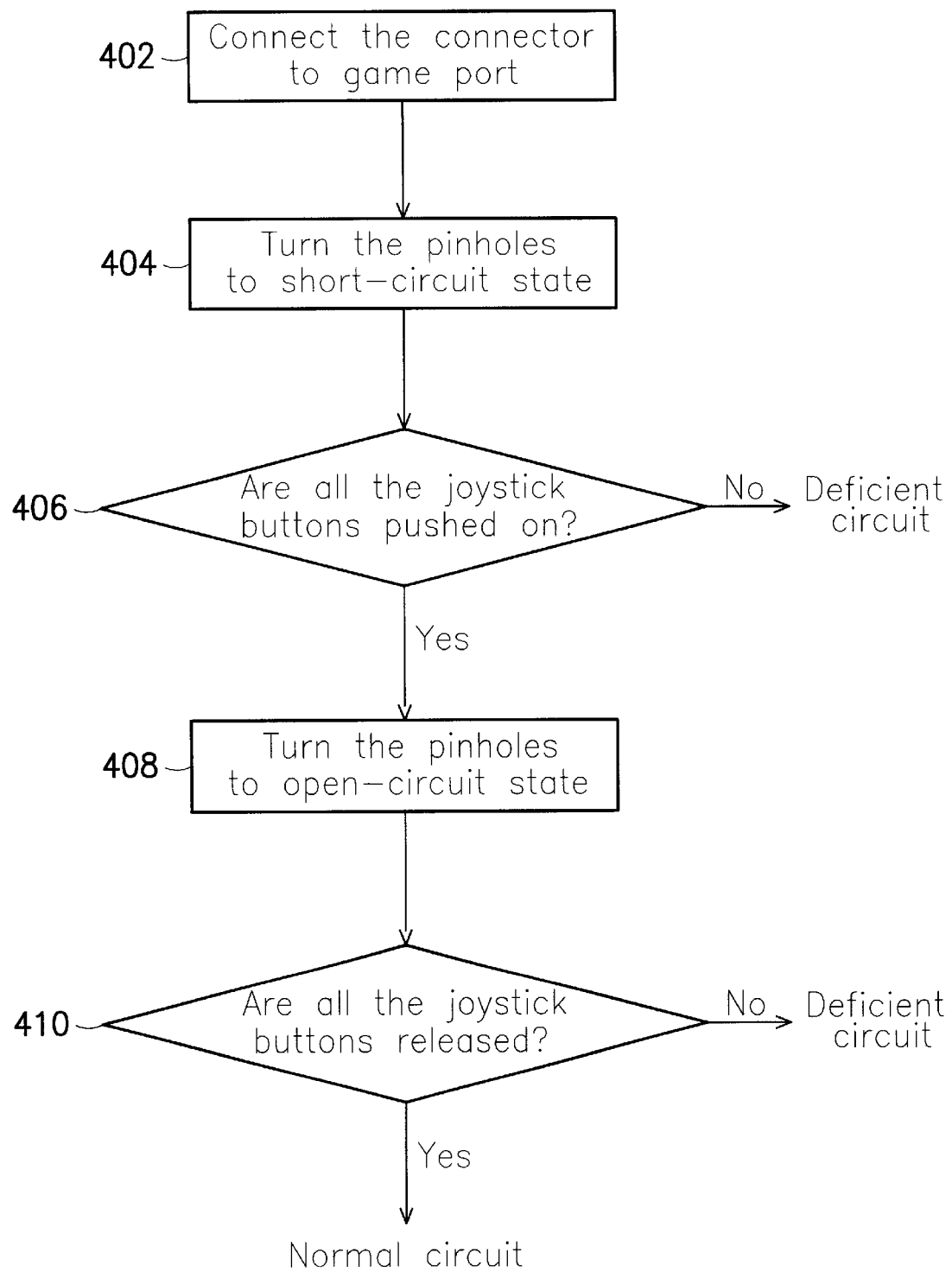
FIG. 4 is a flow diagram illustrating a method for testing a joystick control circuit according to an embodiment of the present invention.

Referring to FIG. 4, a flow diagram shows a testing method of the joystick control circuit using the testing device of the foregoing embodiment, according to an embodiment of the present invention. First, the connector 300 is connected to the game port (step 402). Then, with a short-circuit signal output from the testing program to the latch device 312, the pinholes of the testing device addressed to the joystick buttons are short-circuited, thereby simulating a push on state of the joystick buttons (step 404). Next, according to the results from the testing, it is determined whether the joystick control circuit is functioning normally (step 406) with respect to the input of the testing device. More particularly, it is determined whether the joystick control circuit responds positively to the simulation of the push-on state of the joystick buttons. If the response of the joystick control circuit is positive to the signal of a push-on state, a signal output from the testing program to the latch device 312 then cancels the short-circuit state of the joystick button addressed pinholes, by opening the electric switch 320. Thereby, a release state of the joystick buttons is simulated (step 408). According to the results from the simulation of the release state of the joystick buttons, it is then determined whether the joystick control circuit is functioning normally with respect to a release state of the joystick buttons (step 410). While the invention has been described in the context of an embodiment in regard with only the automatic command of the joystick button testing signal, it will be apparent to those skilled in the art that the modifications described herein can be similarly applied to command the testing signals of the joystick displacement.

Hence, with the testing device described in the foregoing embodiments and examples of the present invention, conventional manual manipulation by a tester employee that must manually remove the connector of the testing device can be substituted with an automatic disconnection performed by a testing program. The foregoing advantage is obtained by the connection of a latch device with an electric switch in the testing device, such that the short-circuit or open-circuit of the pinholes of testing device, respectively simulating the push-on and release states of the joystick buttons, can be commanded by the testing program. Thereby, testing time and efficiency can be improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for testing a joystick control circuit, wherein said joystick control circuit is connected to a game port that comprises a plurality of pins addressed to a plurality of joystick buttons, comprising steps of:
   providing a testing device, latching under an order signal, either shorted circuit or opened circuit in said pins of said game port addressed to said joystick buttons;
   connecting said testing device to said game port;
   outputting a short circuit signal to said testing device for shorting circuit in said pins addressed to said joystick buttons;
   determining whether said joystick control circuit is in a state in accordance with a push-on of said joystick buttons;
   outputting an open circuit signal to said testing device for opening circuit in said pins of said game port addressed to said joystick buttons; and
   determining whether said joystick control circuit is in a state in accordance with a release of said joystick buttons.

2. The method of claim 1, wherein after outputting said short circuit signal to said testing device, if said joystick control circuit not in a configuration of a push-on of said joystick buttons, said joystick control circuit is evaluated as deficient with respect to a push-on of said joystick buttons.

3. The method of claim 1, wherein after outputting said open circuit signal to said testing device, if said joystick control circuit is not in a configuration of a release of said joystick buttons, said joystick control circuit is evaluated as deficient with respect to a release of said joystick buttons.

4. The method of claim 1, wherein said game port comprises a signal pin through which either said short circuit signal and said open circuit signal can be output to said testing device.

5. A method for testing a joystick control circuit, achieved in a testing device, comprising the steps of testing one of game port pins addressed to a joystick button, wherein said game port pin is connected to said test device, outputting a short circuit signal to a latch device for controlling a switching device of said testing device to be at a short-circuit state, after ascertaining said joystick control circuit which is in a state in accordance with a push-on of said joystick button, outputting an open circuit signal to open the switching device of said testing device.

6. An apparatus for testing a joystick control circuit, wherein said joystick control circuit is connected to a game port to which is connected said apparatus, said game port having a plurality of pins among which is a plurality of pins addressed to a plurality of joystick buttons, comprising:
   a connector that has a plurality of pinholes corresponding to said pins of said game port, wherein said pinholes of said connector comprise a signal pinhole and a plurality of pinholes corresponding to said pins of said game port addressed to said joystick buttons;
   an electric switch, connected to said pinholes of said connector; and
   a latch device, connected to said electric switch and said signal pinhole of said connector, wherein said signal pinhole delivers an order signal to said latch device to command said electric switch to either shorted circuit or opened circuit said pinholes of said connector addressed to said joystick buttons.

7. The apparatus of claim 6, wherein said apparatus further comprises:
   a first resistor that simulates a joystick displacement along an X direction;
   a second resistor that simulates a joystick displacement along a Y direction;
   a third resistor that simulates ajoystick displacement along an X direction; and
   a fourth resistor that simulates a joystick displacement along a Y displacement.

8. The apparatus of claim 7, wherein said signal pinhole is connected to one of either said first resistor, said second resistor, said third resistor or said fourth resistor, and serves as an input signal pinhole when said joystick control circuit is tested.

9. The apparatus of claim 8, wherein said pinholes of said connector are:
   pinhole 2, connected to said electric switch;
   pinhole 3, connected to said first resistor;
   pinhole 6, connected to said second resistor;

pinhole 7, connected to said electric switch;
pinhole 10, connected to said electric switch;
pinhole 11, connected to said third resistor;
pinhole 13, connected to said fourth resistor;
pinhole 14, connected to said electric switch;
pinholes 1, 8, and 9 connected to a continuous voltage source; and
pinholes 4 and 5 connected to said electric switch and a ground node.

10. The apparatus of claim 9, wherein said pinholes of said connector that are addressed to said joystick buttons are said pinholes 2, 7, 10, and 14.

11. The apparatus of claim 9, wherein said signal pinhole is said pinhole 3 or 6.

12. The apparatus of claim 6, wherein said electric switch is a transistor.

13. The apparatus of claim 6, wherein said latch device is a flip-flop device.

* * * * *